United States Patent
Burggraf et al.

(10) Patent No.: US 9,224,630 B2
(45) Date of Patent: Dec. 29, 2015

(54) METHOD FOR PRODUCING A WAFER PROVIDED WITH CHIPS

(75) Inventors: Jürgen Burggraf, Schärding/Inn (AT); Markus Wimplinger, Ried im Innkreis (AT); Harald Wiesbauer, Altheim (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 13/635,457

(22) PCT Filed: Mar. 31, 2010

(86) PCT No.: PCT/EP2010/002055
§ 371 (c)(1),
(2), (4) Date: Sep. 17, 2012

(87) PCT Pub. No.: WO2011/120537
PCT Pub. Date: Oct. 6, 2011

(65) Prior Publication Data
US 2013/0011997 A1   Jan. 10, 2013

(51) Int. Cl.
*H01L 21/683* (2006.01)
*H01L 23/00* (2006.01)
(Continued)

(52) U.S. Cl.
CPC ............ *H01L 21/6835* (2013.01); *H01L 24/97* (2013.01); *H01L 25/0657* (2013.01);
(Continued)

(58) Field of Classification Search
CPC ............ H01L 23/49816; H01L 23/49838; H01L 23/5389; H01L 21/6835; H01L 24/97; H01L 25/0657; H01L 21/6836; H01L 25/50; H01L 23/3121; H01L 23/5385; H01L 25/0652; H01L 25/0655; H01L 25/105
USPC ............ 438/458, 107, 108, 109, 689, 692; 257/E21.211, E21.499, E23.06, 778, 257/E21.599, 698, 528, 615, 666, 88, 257/E21.219, E21.23, E23.031, E29.002, 257/E29.089, E29.324, E29.325, E33.001, 257/278, 415

See application file for complete search history.

(56) References Cited

U.S. PATENT DOCUMENTS

| | | | |
|---|---|---|---|
| 7,232,740 B1 | 6/2007 | Mountain | 438/459 |
| 7,713,369 B2 | 5/2010 | Aspar et al. | 156/249 |

(Continued)

FOREIGN PATENT DOCUMENTS

| | | | |
|---|---|---|---|
| AT | 503 053 | 7/2007 | H01L 21/304 |
| CN | 1491439 | 4/2004 | H01L 21/68 |

(Continued)

OTHER PUBLICATIONS

Office Action received in corresponding Chinese Patent Application No. 201080065914.6, dated Oct. 30, 2014 (English translation provided).

(Continued)

*Primary Examiner* — Jarrett Stark
*Assistant Examiner* — Bitew Dinke
(74) *Attorney, Agent, or Firm* — Kusner & Jaffe (57) ABSTRACT

A method for producing a product wafer having chips thereon, comprising the steps of:
  processing the first side of the product wafer
  bonding the product wafer with its first side onto a first rigid carrier wafer with a first intermediate layer consisting of one first adhesion layer applied at least on the edge side,
  processing a second side of the product wafer,
  bonding of the product wafer with its second side on a second rigid carrier wafer with a second intermediate layer consisting of one second adhesion layer applied at least on the edge side, characterized in that the first intermediate layer and the second intermediate layer are made different such that the first carrier wafer can be separated selectively before the second carrier wafer.

19 Claims, 3 Drawing Sheets

(51) Int. Cl.
*H01L 23/538* (2006.01)
*H01L 25/00* (2006.01)
*H01L 21/48* (2006.01)
*H01L 21/56* (2006.01)
*H01L 25/065* (2006.01)
*H01L 25/10* (2006.01)

(52) U.S. Cl.
CPC .............. *H01L25/50* (2013.01); *H01L 21/486* (2013.01); *H01L 21/561* (2013.01); *H01L 23/5384* (2013.01); *H01L 24/16* (2013.01); *H01L 24/81* (2013.01); *H01L 25/0652* (2013.01); *H01L 25/105* (2013.01); *H01L 2221/6839* (2013.01); *H01L 2221/68318* (2013.01); *H01L 2221/68331* (2013.01); *H01L 2221/68372* (2013.01); *H01L 2221/68381* (2013.01); *H01L 2221/68386* (2013.01); *H01L 2224/16225* (2013.01); *H01L 2224/16235* (2013.01); *H01L 2224/81005* (2013.01); *H01L 2224/81192* (2013.01); *H01L 2224/95001* (2013.01); *H01L 2224/97* (2013.01); *H01L 2225/06517* (2013.01); *H01L 2225/06541* (2013.01); *H01L 2225/06572* (2013.01); *H01L 2924/01005* (2013.01); *H01L 2924/01013* (2013.01); *H01L 2924/01033* (2013.01); *H01L 2924/01052* (2013.01); *H01L 2924/01082* (2013.01); *H01L 2924/09701* (2013.01); *H01L 2924/12042* (2013.01)

(56) References Cited

U.S. PATENT DOCUMENTS

| | | | | |
|---|---|---|---|---|
| 8,338,235 | B2* | 12/2012 | Wang | 438/113 |
| 2003/0139019 | A1* | 7/2003 | Kudo et al. | 438/460 |
| 2003/0219969 | A1 | 11/2003 | Saito et al. | 438/622 |
| 2004/0056344 | A1* | 3/2004 | Ogawa et al. | 257/686 |
| 2004/0188861 | A1 | 9/2004 | Kurimoto et al. | 257/786 |
| 2005/0029224 | A1* | 2/2005 | Aspar et al. | 216/33 |
| 2007/0075421 | A1† | 4/2007 | Kuan | |
| 2007/0155129 | A1† | 7/2007 | Thallner | |
| 2008/0003780 | A1† | 1/2008 | Sun | |
| 2008/0044984 | A1* | 2/2008 | Hsieh et al. | 438/459 |
| 2008/0280422 | A1 | 11/2008 | Shin et al. | 438/464 |
| 2009/0218560 | A1* | 9/2009 | Flaim et al. | 257/9 |
| 2009/0298228 | A1* | 12/2009 | Sato et al. | 438/108 |
| 2010/0087033 | A1* | 4/2010 | Mizoguchi et al. | 438/107 |
| 2010/0263794 | A1† | 10/2010 | George | |
| 2010/0326702 | A1* | 12/2010 | Dang et al. | 174/250 |
| 2011/0020982 | A1† | 1/2011 | Wimplinger | |
| 2011/0069467 | A1* | 3/2011 | Flaim et al. | 361/807 |
| 2011/0115070 | A1* | 5/2011 | Lim et al. | 257/698 |
| 2011/0183464 | A1* | 7/2011 | Takahashi et al. | 438/108 |
| 2011/0198721 | A1* | 8/2011 | Yang et al. | 257/506 |
| 2011/0256666 | A1* | 10/2011 | Sugo et al. | 438/113 |
| 2011/0278721 | A1* | 11/2011 | Choi et al. | 257/737 |
| 2011/0308739 | A1* | 12/2011 | McCutcheon et al. | 156/766 |
| 2012/0043672 | A1* | 2/2012 | Cho et al. | 257/778 |
| 2012/0052632 | A1* | 3/2012 | Sato et al. | 438/113 |
| 2012/0184069 | A1* | 7/2012 | Wimplinger | 438/109 |
| 2012/0216959 | A1 | 8/2012 | Thallner | 156/578 |

FOREIGN PATENT DOCUMENTS

| | | | | |
|---|---|---|---|---|
| CN | 1528009 | | 9/2004 | ............. H01L 21/18 |
| JP | 4-283283 | | 10/1992 | ............. C09J 133/00 |
| JP | 8-299377 | | 11/1996 | ............... A61F 7/08 |
| JP | 11-105924 | | 4/1999 | ............. B65D 73/02 |
| JP | 2000-326995 | | 11/2000 | ............. B65D 33/22 |
| JP | 2002-097041 | | 4/2002 | ................. B60J 1/00 |
| JP | 2009-043962 | | 2/2009 | ............. H01L 21/02 |
| WO | WO 97/39481 | | 10/1997 | ............. H01L 21/44 |
| WO | WO 2004/006296 | A2 | 1/2004 | |
| WO | WO 2005/057651 | A1 | 6/2005 | ............. H01L 21/78 |
| WO | WO2005057651 | † | 6/2005 | |
| WO | WO 2009/115240 | | 9/2009 | ............. H01L 21/68 |
| WO | WO2009115240 | † | 9/2009 | |
| WO | WO 2011/093955 | | 8/2011 | ............. H01L 23/48 |

OTHER PUBLICATIONS

Office Action received in corresponding Japanese Application No. 2013-501635, Dated Mar. 17, 2014 (English translation provided).
Int'l Search Report from corresponding PCT/EP2010/002055 (Form PCT/ISA/210); 5 pages.

\* cited by examiner
† cited by third party

METHOD FOR PRODUCING A WAFER PROVIDED WITH CHIPS

FIELD OF THE INVENTION

This invention relates to a method for producing a product wafer which is provided with chips, especially on two sides.

BACKGROUND OF THE INVENTION

By far most of the wafers produced today are provided with chips or so-called dices only on one side. Wafers are equipped in mass production and at the same time there is the requirement of the industry to implement smaller and smaller structures. This also applies to the thickness of the wafer, especially for multilayer wafers which are repeatedly stacked.

The further optimum use of the available space leads to wafers being required which are provided with chips or dices which are more and more double-sided recently, therefore on both sides, and through silicon vias (TSVs) can enable electrical contacts between the front and back of the product wafer.

The greatest problem in the production of these double-sided wafers consists in handling during mass production, which can comprise different production steps, such as for example bonding, debonding, alignment, grinding, etching and many others. Stabilization of the large-area product wafer which generally has a diameter of 300 mm by a carrier wafer is necessary especially due to the thinning/back thinning of the product wafer which is provided in the production process.

Stabilization or support by a carrier wafer in wafers outfitted on one side is therefore comparatively simple since the carrier wafer can be temporarily bonded on the side facing away from the side provided with chips. But here process steps can be necessary on the front and back as well.

Generally, in temporary bonding there is the problem of detaching the product wafer which is passing through the different production steps from the carrier wafer carefully and nondestructively after completion of these production steps. The connection between the carrier wafer and the product wafer therefore during use of different production steps must be strong enough to hold and stabilize the product wafer. At the same time the connection should however then be easily and quickly detachable.

WO 2009/0945558 A2 describes a temporary bonding method for a product wafer which is outfitted on one side.

The generic methods accordingly have in common that each product wafer in the production process must be exposed to at least one process step on each side. The product wafers are processed nowadays, for reasons of easier handling, first at their initial thickness, therefore before back-thinning, on their first side, for example the production of bumps or groups of bumps. Then the product wafer is bonded onto a carrier in order to be able to thereupon subject the product wafer to the process step of back-thinning. After back-thinning generally other process steps are then carried out on the second side, for example in turn the production of bumps and/or groups of bumps and/or other interconnection layers and/or the application of chips. To the extent after processing the second side one process step is again necessary on the first side of the product wafer, in the prior art there is the major problem that the thinned and very sensitive product wafer which has already been provided in part with expensive chips must be detached from the carrier in order to make the first side accessible to further process steps.

The object of this invention is to devise a method for producing a product wafer which is provided with chips especially on two sides, by which the product wafer can be reliably and carefully handled during the production process.

SUMMARY OF THE INVENTION

This object is achieved with the features of claim 1. Advantageous developments of the invention are given in the dependent claims. All combinations of at least the two features given in the specification, the claims and/or the figures also fall within the framework of the invention. At the given value ranges, values within the indicated limits will also be disclosed as boundary values and will be claimed in any combination.

The basic idea of this invention is to provide a method with which the two rigid carrier wafers which are bonded or connected to the respective product wafer can be selectively detached, as a result of which a transfer of the product wafer from the first to the second carrier wafer is enabled, during which the product wafer is being continuously stabilized. This is achieved by the interconnection layers of the two carrier wafers having different properties with respect to their adhesion and/or to the change of their adhesion with action on the interconnection layer, especially by mechanical, thermal, optical and/or chemical methods. It is important here that due to the different properties of the two intermediate layers one of the two intermediate layers is formed or can be changed selectively relative to the other intermediate layer such that this intermediate layer can be detached, while the other intermediate layer maintains its bonding force at least much more strongly than the bonding force of the other intermediate layer. The adhesion is referenced to the effective surface of the interconnection layer.

Fundamentally the selective detachment and/or separation as claimed in the invention always functions by the different adhesion forces between the carrier wafers and the product wafer, the adhesion force relating to the totality of the intermediate layer between the respective carrier wafer and the product wafer as claimed in the invention. A first group of methods as claimed in the invention is characterized in that the adhesion forces acting between the carrier wafers and the product wafer are inherently, i.e. from the start, different. In this case the intermediate layers therefore have different adhesion forces from the start; on the one hand this is achieved by the intermediate layer consisting of a different material or the contact surfaces of the intermediate layers to the respective carrier wafer and/or to the product wafer being pretreated in order to influence the forces acting on the respective contact surfaces. One conceivable embodiment of the invention calls for either adhesion-reducing substances or adhesion-promoting substances to be used to treat the surface of the carrier wafer in whole or in part and/or to treat the surface of the product wafer in whole or in part. There are the following versions which can be applied in combination or individually:

- different adhesive material of the intermediate layers
- different pretreatment of at least one surface/contact surface (in whole or in part) with
- adhesion-reducing substance
- adhesion-promoting substance
- different size of the contact surface or thickness of the intermediate layer.

According to a further group of method versions as claimed in the invention, it is provided that an indicated change of the adhesion forces of the intermediate layers is undertaken by certain measures. In this connection, at a selectable defined instant the adhesion force of one of the two intermediate layers or the two intermediate layers is changed such that the adhesion forces of the two intermediate layers is different after the indicated change of the adhesion force. There are the following possibilities as claimed in the invention:

- controlled local action, especially by irradiation of one intermediate layer, while the other intermediate layer is not irradiated or is only partially irradiated. The controlled local action is possible in another configuration of the invention by the action of solvents on only one intermediate layer while the other intermediate layer is not exposed to solvents or is only partially exposed.
- selectivity by material choice and at least partially inert behavior of one intermediate layer to the applied method step which causes the change of the other intermediate layer, especially by an increase of the temperature, in which one of the two intermediate layers reacts with a less strongly pronounced drop of viscosity, as a result of which this intermediate layer has stronger bonding force against shear forces. It is especially preferred here that one of the two intermediate layers be made inert relative to one solvent, while it dissolves the other intermediate layer.
- change of the adhesion force of the first intermediate layer by action on the first intermediate layer before the second intermediate layer is applied.
- selectivity by ring widths of the edge adhesive zone which are of different magnitude from the start, so that the change of the adhesion force of the first layer is more dramatic than the change of the adhesion force of the second layer by the above described measures.

The rigid carrier wafers are preferably characterized by a high interconnection stiffness. Especially suitable materials, also in combination, are silicone [sic], quartz, glass, ceramic or metal.

Therefore before or during the selective detachment or separation of one of the two carrier wafers the intermediate layer which is assigned to this carrier wafer or the adhesion layer which is provided in the intermediate layer is changed by chemical, thermal, optical and/or mechanical properties of the adhesion layer or by influence to such a degree that the carrier wafer can be carefully removed without damage, while the product wafer remains on the other carrier wafer. The other carrier wafer stabilizes the product wafer at the same time.

Chips for the purposes of this invention are those structures or integrated electronic components which are conventionally applied to a wafer. Bumps or groups of bumps are used for tying the chips to the product wafer or the electronic interconnection of individual circuits of the chip to the corresponding chips or circuits which have applied on the opposite side of the product wafer and/or for later mounting of the entire system on a circuit board.

As a result of the method as claimed in the invention not only can a product wafer be provided with chips especially on two sides, but the method as claimed in the invention is especially advantageous for stacks of product wafers provided with chips especially on two sides, since selective removal of the carrier wafer yields a careful and effective as well as flexible method for producing stacked product wafers.

Processing of the product wafer can comprise one or more known processes, especially the application of bumps and/or groups of bumps and/or chips to the second side and/or the back-thinning/grinding of the product wafer, as well as the production of so-called redistribution layers (RDL). Product wafers for the purposes of this invention also comprise so-called silicon imposers which have only wiring layers (RDL layers) in order to later accommodate chips with active structures.

In another embodiment of the invention, it is provided that the bonding force of the first adhesion layer is less than the bonding force of the second adhesion layer. Bonding force means the connection force or adhesion force which acts through the respective intermediate layer between the product wafer and the carrier wafer and which counteracts separation of the carrier wafer from the respective product wafer, each referenced to the active bonding area/adhesion area. The difference between the bonding force of the first adhesion layer and the bonding force of the second adhesion layer as claimed in the invention is advantageously so great that when the first carrier wafer is detached from the product wafer the second carrier wafer remains interconnected to the product wafer.

By the first adhesion layer having smaller dimensions than the second adhesion layer, especially a smaller contact area of the first adhesion layer with the first carrier wafer and the product wafer and/or a thinner layer thickness, the invention can be implemented solely by choosing the geometrical configuration so that even in its chemical properties identical intermediate layers or intermediate layers of the same material can be used.

According to another advantageous embodiment of the invention it is provided that the first adhesion layer has chemical properties different from the second adhesion layer such that the first adhesion layer is at least partially dissolved by a first solvent, while the second adhesion layer is at least largely inert with reference to the first solvent. In this way the invention is implemented by the chemical properties of the adhesion layers or intermediate layers.

In other words: The selectivity of the solvents allows controlled dissolution of defined regions, especially edge regions, of the respective adhesion layer or intermediate layer, therefore a selective reduction in the size of the effective adhesion area/bonding area.

Here it is advantageous if the ratio of the dissolution rate $A_1$ of the first solvent relative to the adhesion layer to the dissolution rate $A_2$ of the second solvent relative to the second adhesion layer is less than 1:3, especially less than 1:10, preferably less than 1:20, even more preferably less than 1:100.

To the extent the separation of the first carrier wafer from the product wafer with rising temperature takes place before separation of the second carrier wafer due to different thermal properties of the first intermediate layer and the second intermediate layer, the invention can be advantageously implemented by temperature control. The adhesion layers in this embodiment differ in their thermal properties, especially the viscosity, as a function of the temperature. The carrier wafer which is to be detached first is bonded to the intermediate layer with a cement which has a lower viscosity than the other carrier wafer at a certain temperature. The carrier wafer which is to be detached can then be separated nondestructively by shearing it off.

According to another embodiment of the invention it is advantageously provided that the separation of the first carrier wafer from the product wafer takes place selectively as a result of different optical properties of the first and second interconnection layers, especially with reference to the action of defined light wavelengths and/or defined light intensities. Here selective detachment or separation is controlled by the incident radiation of light. The light has two characterizing physical parameters, specifically on the one hand the wavelength of the photons which correlates with the energy and which can control the mainly chemical crosslinking process, and on the other hand the intensity, therefore the number of photons per time and unit of area, which is directly related to the heat output. The material of the respective adhesion layer has a characteristic frequency-dependent and thus wavelength-dependent spectrum of its dielectric properties; this can also be called a resonance spectrum. By choosing the corresponding wavelength of the incident light in this respect chemical and physical processes can be controlled.

Some polymers crosslink for example under UV radiation, conversely infrared radiation can be used to directly heat up materials and thus physical properties such as for example the viscosity can be controlled. Local heating of the adhesion layer can take place for example by laser light; this is advantageous especially for the adhesion layer provided in the region of the periphery of the intermediate layer or of the wafer periphery, therefore an annular adhesion layer. It is especially advantageous to provide crosslinking which can be cancelled by UV illumination.

According to another advantageous embodiment of the invention it is provided that the separation of the first carrier wafer from the product wafer takes place selectively as a result of different mechanical properties of the first and second intermediate layer, especially with reference to their shear strength. The intermediate layer with the lower shear strength opposes a smaller resistance to the shear force applied from the outside so that the carrier wafer attached to the product wafer by this intermediate layer detaches or can be detached from the opposing carrier wafer. Adhesion is caused mainly by Van der Waals forces.

The separation of the carrier wafer by shearing off is further optimized by combination with temperature treatment, especially when using thermoplastic cements as connecting means which have different viscosity behaviors depending on temperature.

To the extent the thickness $B_1$ of the first intermediate layer or first adhesion layer is greater than the thickness $B_2$ of the second intermediate layer or second adhesion layer, this measure reduces the required shearing force for separating the first carrier wafer, especially at a ratio $B_1/B_2$ of 3/2, preferably 2/1, even more preferably 3/1, ideally 4/1, the second intermediate layer which is not to be detached or which is to be detached subsequently having a thickness $B_2$ from 15 to 50 µm, preferably 20 to 40 µm, even more preferably 25 to 30 µm.

In another advantageous embodiment of the invention, it is provided that the first and/or the second adhesion layer are made annular, especially in the region of the periphery of the product wafer. In this way the adhesion layer can be processed in terms of the periphery; this is especially advantageous when using solvents since the solvent in this case need diffuse only over a very short distance.

According to another embodiment of the invention it is advantageously provided that the first intermediate layer, especially within the annular adhesion layer, comprises a film with low adhesion action and/or the second intermediate layer comprises a film with low adhesion action which is located especially within the annular adhesion layer. Low adhesion action in relation to the adhesion action of the adhesion layer is meant and is especially at least twice, preferably at least triple, even more preferably at least five times, ideally at least ten times, stronger. The relation is referenced to the adhesion action in a dynamic state, therefore during the separation process, but especially in addition is referenced to the static state, therefore prior to the separation process. The film according to one embodiment of this invention can be provided as a partial coating of the first and/or second intermediate layer or the first and/or second adhesion layer, the partial coating leading to a reduction of the adhesion action, especially as an antiadhesion coating. It is important here that the film reduces a part of the effective contact surface of the respective intermediate layer with the corresponding carrier wafer in the adhesion action.

A device provided as claimed in the invention has suitable means for application of the above described method, specifically selective separating agents for selective separation of the first carrier wafer from the product wafer as a result of the different properties of the first intermediate layer from the second intermediate layer. Known devices can be used for mechanical separation, for example by applying opposite tensile forces to the first carrier wafer and to the second carrier wafer away from the product wafer or a shearing force to the first carrier wafer and to the second carrier wafer in the opposite direction along the product wafer. The selective separating agents are however as claimed in the invention made such that there are suitable devices for selective separation.

BRIEF DESCRIPTION OF THE DRAWINGS

Other advantages, features and details of the invention will become apparent from the following description of preferred exemplary embodiments and using the drawings which are sectional views.

DETAILED DESCRIPTION OF PREFERRED EMBODIMENTS

The same components and parts with the same function are identified with the same reference numbers.

Figure 1:
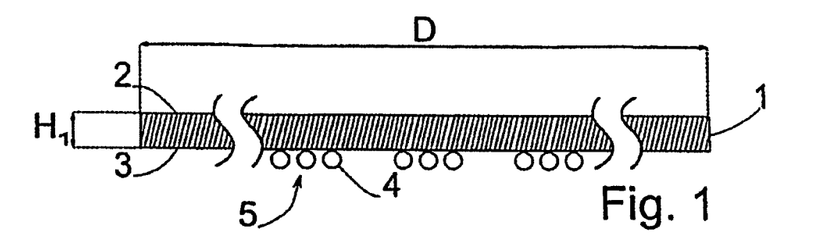
FIG. 1 shows a product wafer in a first method step as claimed in the invention.
Figure 4:
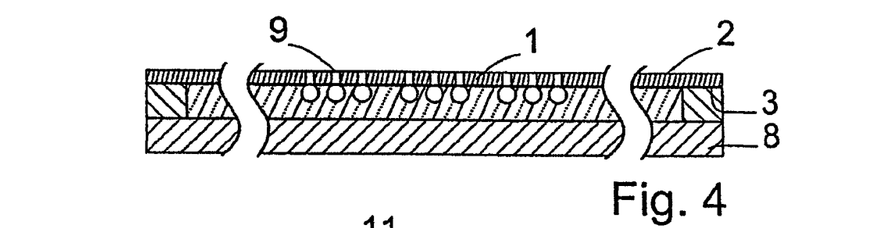
FIG. 4 shows a product wafer in a fourth method step as claimed in the invention.
Figure 9:
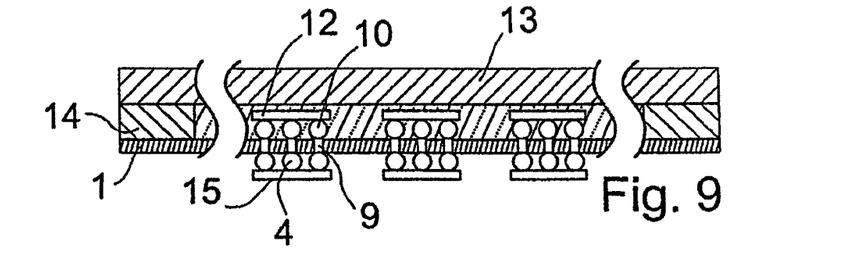
FIG. 9 shows a product wafer in a ninth method step as claimed in the invention.

FIG. 1 shows a product wafer 1 which is still comparatively thick at this instant of the method and which is provided with bumps 4 or groups 5 of bumps formed from the bumps 4. The product wafer 1 at this instant, due to its thickness $H_1$, is relatively stable and in this respect inherently relatively stable without aids. The number of bumps 4 and their position within a group 5 of bumps depend on the respective chip 15 (also called a dice) which is applied to the bumps 4 in a later method step (see 4 and 9).

The product wafer 1 has a first side 3 and a second side 2, the bumps 4 or the groups 5 of bumps in the first process step as shown in FIG. 1 being applied to the first side 3. Application takes place such as is known in the prior art.

Figure 2:
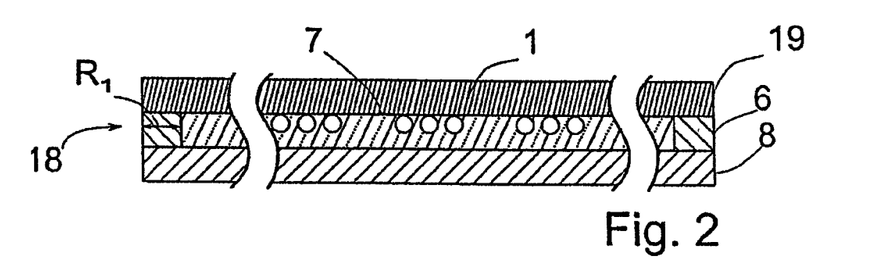
FIG. 2 shows a product wafer in a second method step as claimed in the invention.

In the second process step as shown in FIG. 2 the product wafer 1 for stabilization with its first side 3 is bonded temporarily on a first carrier wafer 8, a first intermediate layer 18 being used for bonding. The first intermediate layer 18 in the embodiment shown here consists of a first adhesion layer 6 and a first film 7, the first adhesion layer 6 being used for bonding and the film 7 being used for embedding of the bumps 4. FIGS. 1 to 12 show one cross section at a time and in the exemplary embodiments shown here the product wafer 1 is made as a round disk with a diameter D of 300 millimeters. The product wafer 1 can however also have any other disk shape and a different diameter D.

The first adhesion layer 6 in the embodiment shown in FIG. 2 is located in the region of a lateral wafer periphery 19 and extends from the wafer periphery 19 by a fraction of the diameter D, especially with a ring width $R_1$ of less than one tenth, to the inside, so that in the illustrated embodiment an annular body for the first adhesion layer 6 arises. The ratio $R_1/D$ is especially less than 1/20, preferably less than 1/30, even more preferably less than 1/60, still more preferably less than 1/120. The ring width $R_1$ is especially less than 15 mm, preferably less than 10 mm, even more preferably less than 5 mm, still more preferably less than 2 mm. Within the annular body is the film 7 and the latter is completely surrounded by the product wafer 1, the first adhesion layer 6 and the first carrier wafer 8.

The film 7 according to one preferred embodiment is provided as a partial coating of the first adhesion layer 6, the adhesion layer 6 in this alternative embodiment which is not shown extending over the entire first carrier wafer 8. The partial coating is provided in dimensions analogously to the film 7 which is shown in FIG. 2.

Figure 11:
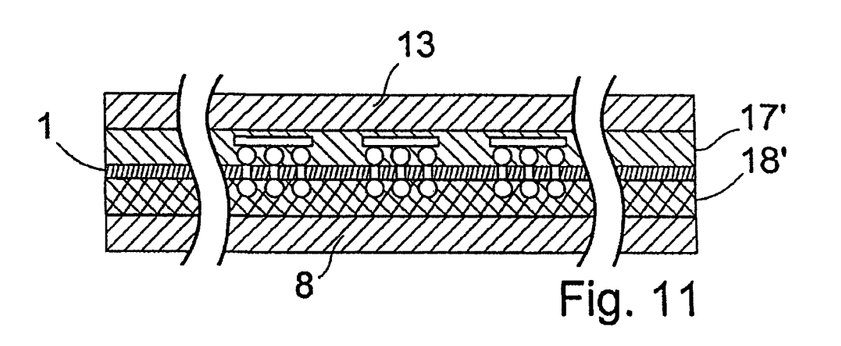
FIG. 11 shows a product wafer in an alternative seventh method step as claimed in the invention.

In the case of the alternative embodiment as shown in FIG. 11, the first intermediate layer 18' is formed from a single material and extends over the entire area of the product wafer 1. In this case the first intermediate layer 18' in its adhesion capacity is dependent on temperature, so that as the temperature rises the adhesion capacity, therefore the bonding force, decreases, especially due to the reduction of the viscosity so that the cement has reduced resistivity to shear forces.

Figure 3:
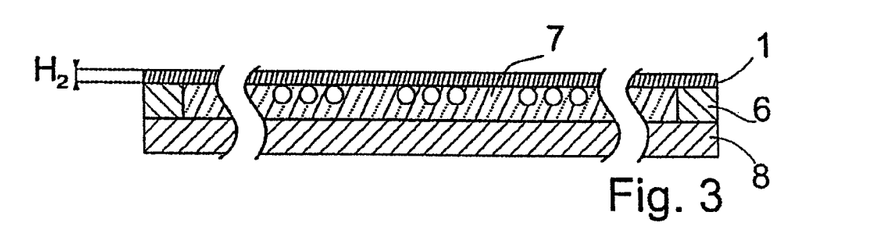
FIG. 3 shows a product wafer in a third method step as claimed in the invention.
Figure 10:
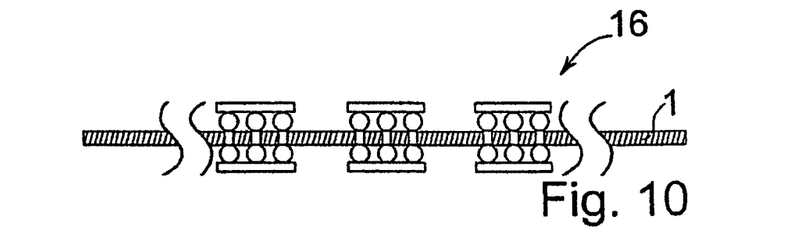
FIG. 10 shows a product wafer in a tenth method step as claimed in the invention.

In the first process step as claimed in the invention as shown in FIG. 3, the product wafer 1 is back-thinned by known methods from its original thickness $H_1$ as shown in FIG. 1 to a thickness $H_2$ of less than 150 μm which corresponds to the end product as shown in FIG. 10, especially less than 100 μm, preferably less than 70 μm, even more preferably less than 50 μm, even more preferably less than 30, even more preferably less than 20 μm.

Figure 5:
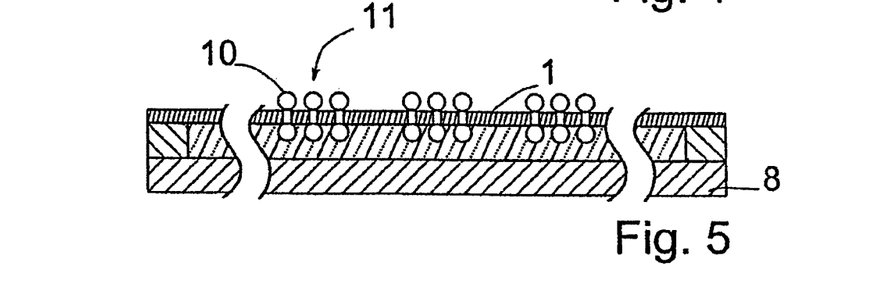
FIG. 5 shows a product wafer in a fifth method step as claimed in the invention.

In the fourth method step shown in FIG. 4, VIAs 9 which penetrate the product wafer 1 are etched into the product wafer 1 in order to form an electrical connection from the first side 3 to the second side 2 between the bumps 4 and in a fifth method step as shown in FIG. 5 to form bumps 10 or groups 11 of bumps which are to be applied on the second side 2.

Figures 6, 7:
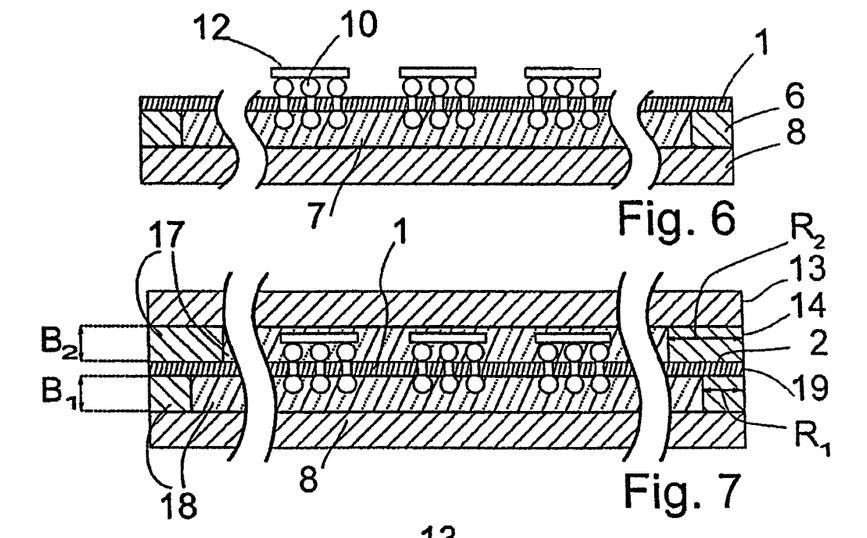
FIG. 6 shows a product wafer in a sixth method step as claimed in the invention.
FIG. 7 shows a product wafer in a seventh method step as claimed in the invention.

In a sixth method step as shown in FIG. 6 chips 12 are applied to the pertinent bumps 10 or groups 11 of bumps.

One of the method steps which is decisive as claimed in the invention is the seventh method step which is shown in FIG. 7 and in which the second side 2 is bonded to a second carrier wafer 13 analogously to the method step described in FIG. 2 via a second intermediate layer 17 which differs from the first intermediate layer 18 in at least one relevant property.

The second intermediate layer 17 in this embodiment consists of a second adhesion layer 14 which extends likewise from the lateral wafer periphery 19 of the product wafer 1 over a fraction of the diameter D, especially with a ring width $R_2$ up to a maximum one tenth of the diameter D. In this embodiment the second adhesion layer 14 is made as a circular ring with a ring width $R_2$ which is greater than the ring width $R_1$ of the first adhesion layer 6. The ratio $R_1/R_2$ is between 1/10 and 9/10, especially between 1/5 and 4/5, preferably between 1/4 and 3/4, even more preferably between 1/3 and 2/3. The ratio $R_2/D$ is especially less than 1/20, preferably less than 1/30, even more preferably less than 1/60, even more preferably less than 1/120. The ring width $R_2$ is especially less than 15 mm, preferably less than 10 mm, still more preferably less than 5 mm, even more preferably less than 2 mm.

In this way the effective adhesion area/bonding area for the second adhesion layer 14 between the product wafer 1 and the second carrier wafer 13 is larger.

In one alternative embodiment of the invention which can also be combined with this embodiment, the thickness $B_1$ of the first intermediate layer 18 is greater than the thickness $B_2$ of the second intermediate layer 17, especially in a ratio $B_1/B_2$ of at least 3/2, preferably 2/1, even more preferably 3/1, ideally at least 4/1.

Figure 8:
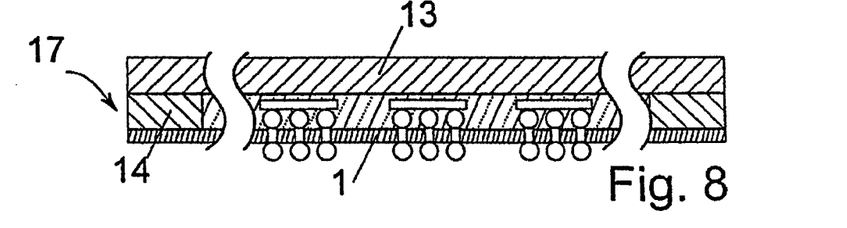
FIG. 8 shows a product wafer in an eighth method step as claimed in the invention.

In an eighth method step as shown in FIG. 8 the first carrier wafer 8 is detached by reducing the bonding force of the first adhesion layer 6 and by applying a tensile force which is pointed away from the product wafer 2. The reduction of the bonding force can already be implemented or can have been carried out in an earlier method step. Alternatively the second carrier wafer 8 can be sheared off by oppositely acting shear forces in the first and second carrier wafer 8, 13 parallel to the product wafer 1. Another alternative consists in peeling off the carrier wafer, beginning from its edge. In the course of peeling off, the carrier wafer on its edge is elastically bent, as a result of which propagation of the separating front takes place beginning from the edge to the center of the carrier wafer and then to the opposite edge, while the second carrier wafer and the product wafer are fixed on a support in order to counteract bending of the second carrier wafer and the product wafer. Separation can take place in one advantageous embodiment by mechanical separation, especially by introducing a mechanical element at one site on the edge of the periphery of the intermediate layer. The mechanical element can be for example a flat wedge.

As a result of the larger adhesion area and the bonding force of the second adhesion layer 14 which is stronger in this respect relative to the first adhesion layer 6, the first carrier wafer 8 is automatically detached. To the extent residues of the film 7 or of the adhesion layer 6 remain on the product wafer 2 during detachment, they can be removed by a cleaning step. In the embodiment shown in FIGS. 7 and 8, the first carrier wafer 8 has accordingly been detached based on the geometrical configuration, therefore due to the larger adhesion area of the second adhesion layer 14. In the alternative embodiment shown in FIG. 11 the first intermediate layer 18' has different thermal properties from the second intermediate layer 17' such that the first intermediate layer 18' reduces its adhesion force or bonding force more quickly than the second intermediate layer 17'.

According to one preferred embodiment of the invention the method proceeds as follows:
 bonding of the product wafer 1 with its first side 3 on a first rigid carrier wafer 8 with a first intermediate layer 18 consisting of one first adhesion layer applied at least on the edge side,
 at least partial dissolving of the first adhesion layer 6,
 bonding of the product wafer 1 with a second side 2 on a second rigid carrier wafer 13 with a second intermediate layer 17 consisting of one second adhesion layer 14 applied at least on the edge side and separating the first carrier wafer, especially by application of shearing forces acting oppositely on the first carrier wafer 8 and the second carrier wafer 13 parallel to the product wafer 1 or by peeling off the first carrier wafer 8.

The first and second adhesion layer 6, 14 are preferably of the same material and are distributed over the entire area of the respective carrier wafer, on the respective bonding area/adhesion area of the adhesion layers to the respective carrier wafer first and second partial coatings of the first and second adhesion layers 6, 14, are applied in order to achieve a distinct reduction of the adhesion force in the region of application.

Figure 12:
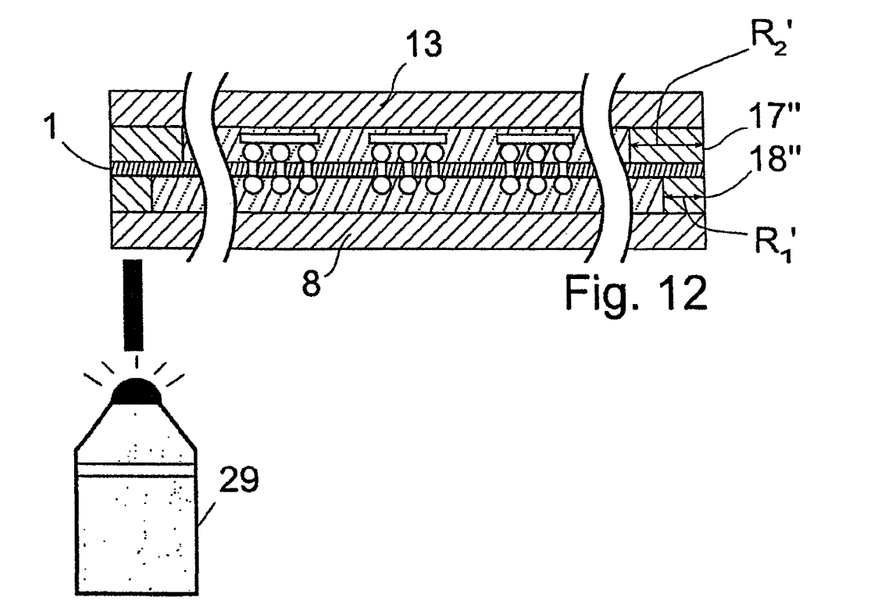
FIG. 12 shows a product wafer in an alternative seventh method step as claimed in the invention.

In the alternative embodiment shown in FIG. 12 the first adhesion layer 18″ is made analogously to the embodiment as shown in FIG. 7 with a smaller ring width R1' than the ring width R2' of the second adhesion layer 17″, so that a light source 29 acts on the first adhesion layer 18″ and the second adhesion layer 17″, to the extent the two adhesion layers 17″, 18″ are the same material. Due to the larger ring width R2' of the second adhesion layer 17″ the first carrier wafer 8 can be detached before the second carrier wafer 13, especially since the light source 29 is advantageously made to act in a relatively focused manner. It can be for example a UV light source.

Alternatively the first adhesion layer 18″ and the second adhesion layer 17″ can be made to react relative to different light intensities/light frequencies.

It is common to the above described embodiments that the first adhesion layer 18, 18', 18″ is different from the second adhesion layer 17, 17', 17″ such that for the corresponding action a smaller adhesion force or bonding force acts between the product wafer 1 and the first carrier wafer 8 compared to the adhesion force or bonding force between the product wafer 1 and the second carrier wafer 13.

In the ninth method step which is shown in FIG. 9, chips 15 are applied to the bumps 4 and thus are electrically connected in a conductive manner to the chips 12 analogously to the sixth method step as shown in FIG. 6.

After detachment of the second carrier wafer 13 in a tenth method step as shown in FIG. 10, a product wafer 16 which is outfitted on two sides remains. To the extent stacks of product wafers 16 are to be produced, according to the ninth method step as shown in FIG. 9 almost any number of product wafers 1 outfitted with chips 12, 15 can be stacked, and the N-th adhesion layer must have a smaller bonding force during detachment than the N+1-th adhesion layer. This means that analogously to the above described procedure the modification of the N-th adhesion layer/intermediate layer takes place either directly when the N-th carrier wafer is detached or before detachment of the N-th carrier wafer, especially before bonding of the N+1-th carrier wafer.

Instead of the film 7, the region filled by the film 7 can be alternatively filled with gas or can be evacuated.

The embodiment shown in FIGS. 1 to 9 is advantageously supported by chemical solvents in the dissolution of the first and second adhesion layer 6, 14. Accordingly combinations of chemical, thermal, optical and mechanical method steps for dissolving the adhesion layers are possible.

In methods with blanket intermediate layers, such as shown for example in FIG. 11, rather optical and/or thermal dissolution methods are recommended, while the use of solvents seems less suitable due to the diffusion time in terms of the wafer periphery 19.

Having described the invention, the following is claimed:

1. Method for producing a product wafer, the method including steps of:

bonding a first side of the product wafer to a first rigid carrier wafer with a first intermediate layer, the first intermediate layer including one first adhesion layer applied at least on the edge side of the first side of the product wafer, the first adhesion layer made of a first material, processing a second side of the product wafer opposite to the first side by application of chips to the second side, bonding the second side of the product wafer to a second rigid carrier wafer with a second intermediate layer, the second intermediate layer including:

one second adhesion layer applied at least on the edge side of the second side of the product wafer, the second adhesion layer being made of a second material wherein the first adhesion layer and the second adhesion layer are made from different materials such that both rigid carrier wafers bonded to the product wafer can be separated selectively from the product wafer, after both the first rigid carrier wafer and the second rigid carrier wafer are bonded to the product wafer, applying a first force to the combination of the first rigid carrier wafer, the second rigid carrier wafer and the product wafer wherein the first rigid carrier wafer and the first intermediate layer are separated from the product wafer, and after the first rigid carrier wafer and the first intermediate layer are separated from the product wafer, applying a second force to the second rigid carrier wafer wherein the second rigid carrier wafer and the second intermediate layer are separated from the product wafer.

2. Method as claimed in claim 1, wherein the first adhesion layer has a bonding force that is smaller than the bonding force of the second adhesion layer.

3. Method as claimed in claim 1, wherein a contact area between the first adhesion layer and the product wafer and/or the first rigid carrier wafer is smaller than the contact are between the second adhesion layer and the product wafer and/or the second rigid carrier wafer.

4. Method as claimed in claim 1, wherein said step of applying a first force includes exposing that first adhesion layer and the second adhesion layer to a first solvent wherein the first adhesion layer is at least partially dissolved by the first solvent, while the second adhesion layer is at least largely inert with reference to the first solvent.

5. Method as claimed in claim 1, wherein said step of applying a first force includes exposing the first adhesion layer and the second adhesion layer to a predetermined temperature wherein the first adhesion layer is at least partially dissolved and the second adhesion layer is at least largely unchanged so that the separation of the first carrier wafer can be effected before separation of the second carrier wafer.

6. Method as claimed in claim 1, wherein said step of applying a first force includes exposing the first adhesion layer and the second adhesion layer to a light source of a predetermined intensity and/or wavelength wherein the light source acts selectively on the first adhesion layer and/or the second adhesion layer.

7. Method as claimed in claim 1, wherein the first adhesion layer has a shear strength that is less than a shear strength of the second adhesion layer.

8. Method as claimed in claim 1, wherein the first and/or the second adhesion layer are made annular, especially in the region of the periphery of the product wafer.

9. Method as claimed in claim 1, wherein between the first carrier wafer and the first intermediate layer a first partial coating applied especially on the first carrier wafer is applied for reducing the bonding force/adhesion force in the region of the first partial coating and/or between the second carrier wafer and the second intermediate layer a second partial coating applied especially on the second carrier wafer is applied for reducing the bonding force/adhesion force in the region of the second partial coating.

10. Method as claimed in claim 1, wherein the first force is equal to the second force.

11. Method for producing a product wafer, the method including steps of
- bonding a first side of the product wafer to a first rigid carrier wafer with a first intermediate layer, the first intermediate layer including one first adhesion layer applied at least on the edge side of the first side of the product wafer, the first adhesion layer made of a first material,
- processing a second side of the product wafer opposite to the first side by application of chips to the second side,
- bonding the second side of the product wafer to a second rigid carrier wafer with a second intermediate layer, the second intermediate layer including:
  - one second adhesion layer applied at least on the edge side of the second side of the product wafer and made of a second material, wherein a contact area between the first adhesion layer and the first rigid carrier wafer and/or the product wafer is less than a contact area between the second adhesion layer and the second rigid carrier wafer and/or the product wafer such that both rigid carrier wafers bonded to the product wafer can be separated selectively from the product wafer,
- after both the first rigid carrier wafer and the second rigid carrier wafer are bonded to the product wafer, applying a first force to the combination of the first rigid carrier wafer, the second rigid carrier wafer and the product wafer wherein the first rigid carrier wafer and the first intermediate layer are separated from the product wafer, and
- after the first rigid carrier wafer and the first intermediate layer are separated from the product wafer, applying a second force to the second rigid carrier wafer wherein the second rigid carrier wafer and the second intermediate layer are separated from the product wafer.

12. Method as claimed in claim 11, wherein the first and/or the second adhesion layer are made annular, especially in the region of the periphery of the product wafer.

13. Method as claimed in claim 11, wherein the first material and the second material are the same.

14. Method for producing a product wafer, the method including steps of:
- bonding a first side of the product wafer to a first rigid carrier wafer with a first intermediate layer, the first intermediate layer including one first adhesion layer applied at least on the edge side of the first side of the product wafer, the first adhesion layer made of a first material,
- processing a second side of the product wafer opposite to the first side by application of chips to the second side,
- bonding the second side of the product wafer to a second rigid carrier wafer with a second intermediate layer, the second intermediate layer including:
  - one second adhesion layer applied at least on the edge side of the second side of the product wafer and made of a second material, wherein a thickness of the first adhesion layer is less than a thickness of the second adhesion layer such that both rigid carrier wafers bonded to the product wafer can be separated selectively from the product wafer,
- after both the first rigid carrier wafer and the second rigid carrier wafer are bonded to the product wafer, applying a first force to the combination of the first rigid carrier wafer, the second rigid carrier wafer and the product wafer wherein the first rigid carrier wafer and the first intermediate layer are separated from the product wafer, and
- after the first rigid carrier wafer and the first intermediate layer are separated from the product wafer, applying a second force to the second rigid carrier wafer wherein the second rigid carrier wafer and the second intermediate layer are separated from the product wafer.

15. Method as claimed in claim 14, wherein the first and/or the second adhesion layer are made annular, especially in the region of the periphery of the product wafer.

16. Method as claimed in claim 14, wherein the first material and the second material are the same.

17. Method as claimed in claim 1, wherein both the first adhesion layer and the second adhesion layer are made of a polymer.

18. Method as claimed in claim 12, wherein a ratio of a ring width of the first adhesion layer to a ring width of the second adhesion layer is between about 1/10 and 9/10.

19. Method as claimed in claim 14, wherein a ratio of a thickness of the first adhesion layer to a thickness of the second adhesion layer is about 2/3.

* * * * *